(12) United States Patent
Coppola

(10) Patent No.: US 10,477,740 B2
(45) Date of Patent: Nov. 12, 2019

(54) SMART EMI VENT

(71) Applicant: Parker-Hannifin Corporation, Cleveland, OH (US)

(72) Inventor: Stephen J. Coppola, Waltham, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 160 days.

(21) Appl. No.: 15/755,193

(22) PCT Filed: Sep. 14, 2016

(86) PCT No.: PCT/US2016/051576
§ 371 (c)(1),
(2) Date: Feb. 26, 2018

(87) PCT Pub. No.: WO2017/048745
PCT Pub. Date: Mar. 23, 2017

(65) Prior Publication Data
US 2018/0249600 A1    Aug. 30, 2018

Related U.S. Application Data

(60) Provisional application No. 62/218,650, filed on Sep. 15, 2015.

(51) Int. Cl.
| | | |
|---|---|---|
| *H05K 9/00* | (2006.01) | |
| *H05K 5/02* | (2006.01) | |
| *H05K 7/20* | (2006.01) | |

(52) U.S. Cl.
CPC ......... *H05K 9/0041* (2013.01); *H05K 5/0213* (2013.01); *H05K 7/20209* (2013.01); *H05K 9/0081* (2013.01)

(58) Field of Classification Search
CPC ............ H05K 5/0213; H05K 7/20181; H05K 7/20209; H05K 9/0041; H05K 9/0081
See application file for complete search history.

(56) References Cited

U.S. PATENT DOCUMENTS

| | | | | |
|---|---|---|---|---|
| 5,460,571 A | * | 10/1995 | Kato | ...................... F04D 29/703 361/695 |
| 6,297,446 B1 | | 10/2001 | Cherniski et al. | |

(Continued)

FOREIGN PATENT DOCUMENTS

| | | |
|---|---|---|
| CN | 101174478 A | 5/2008 |
| CN | 202536174 U | 11/2012 |

(Continued)

OTHER PUBLICATIONS

The International Search Report and the Written Opinion of the International Search Authority for corresponding International Application No. PCT/US2016/051576 dated Nov. 24, 2016.

*Primary Examiner* — Jacob R Crum
(74) *Attorney, Agent, or Firm* — Renner, Otto, Boisselle & Sklar, LLP

(57) ABSTRACT

An EMI shielded vent panel for disposition over a corresponding opening in an electronics enclosure includes an electrically conductive medium having a plurality of ventilation passageways, each passageway including an entry and a channel connected to and extending away from the entry; wherein each passageway is selectively actuated between at least a first constricted state and a second deconstricted state upon application of or removal of an activation mechanism.

16 Claims, 3 Drawing Sheets

(56) References Cited

U.S. PATENT DOCUMENTS

| | | | |
|---|---|---|---|
| 6,426,459 B1 * | 7/2002 | Mitchell | H05K 9/0041 |
| | | | 174/382 |
| 6,671,186 B2 | 12/2003 | Kopf | |
| 9,764,617 B2 | 9/2017 | Baker | |
| 2009/0135579 A1 | 5/2009 | Kim et al. | |
| 2011/0297413 A1 | 12/2011 | Liu et al. | |
| 2012/0112552 A1 | 5/2012 | Baarman et al. | |
| 2013/0320188 A1 * | 12/2013 | Sun | H05K 7/20181 |
| | | | 248/674 |
| 2015/0216076 A1 * | 7/2015 | Gilliland | H05K 9/0041 |
| | | | 165/276 |

FOREIGN PATENT DOCUMENTS

| | | |
|---|---|---|
| CN | 103917389 A | 7/2014 |
| CN | 104223498 A | 12/2014 |
| CN | 204030596 U | 12/2014 |
| CN | 104597992 A | 5/2015 |
| WO | 1997/032459 A1 | 9/1997 |

\* cited by examiner

SMART EMI VENT

This application is a national phase of International Application No. PCT/US2016/051576 filed on Sep. 14, 2016 and published in the English language, and claims priority to U.S. Provisional Application No. 62/218,650 filed on Sep. 15, 2015, which are incorporated herein by reference.

FIELD OF INVENTION

The present invention relates to an EMI shielding ventilation panel, and more particularly, to an EMI shielding vent that is self-regulating.

BACKGROUND

In general, the operation of electronic devices such as monitors, radios, computers, medical instruments, business machines, communications equipment, and the like is attended by the generation of electromagnetic radiation within the electronic circuitry of the equipment. Such radiation often develops as a field or as transients within the radio frequency band of the electromagnetic spectrum, i.e., between about 10 KHz and 10 GHz, and is termed "electromagnetic interference" or "EMI". EMI is known to interfere with the operation of other proximate electronic devices. "EMI" is used herein interchangeably with the term "radio frequency interference" ("RFI").

For attenuating EMI effects, suitable EMI shielding having the capability of absorbing and/or reflecting EMI energy may be employed both to confine the EMI energy within a source device, and to insulate that device or other "target" devices from other source devices. Such shielding is provided as a barrier which is interposed between the source and the other devices, and most often is configured as an electrically conductive and grounded housing or other enclosure which surrounds the EMI generating circuitry of the source device. However, when such circuitry is contained within the confined space of an enclosure, it often is necessary to provide a cooling or ventilation means to dissipate the heat which is generated by the circuitry. Most enclosures therefore are formed with one or more air intake and/or exhaust openings or ports for natural or forced convective circulation of air between the interior of the enclosure and the ambient environment.

Left uncovered, such openings would represent a discontinuity in the surface and ground conductivity of the enclosure, with the result of a decrease in the EMI shielding effectiveness of the enclosure. Accordingly, shielded vent panels have been used for covering the openings in a manner which allows ventilation of the enclosure while electrical continuity, i.e., grounding, across the vent opening is maintained.

In basic construction, such vent panels, which are sized to span the corresponding opening in the enclosure, conventionally are formed from a sheet of a porous, electrically-conductive shielding media, i.e. a vent opening, and an electrically-conductive frame member configured to support the media by circumscribing the outer periphery thereof. The media, which may be a honeycombed-structured or other cellular structured conductive material, is received in or is otherwise attached to the frame, which typically is provided as an extruded aluminum, stainless steel, Monel, or other metals. The frame, in turn, may be fastened to the enclosure over the opening thereof with screws or the like, and a compressible, electrically-conductive seal or gasket is optionally provided for improved electrical contact between the frame and the enclosure.

In view of the proliferation of electronic devices, it is to be expected that continued improvements in EMI shielded vent panels would be well-received by the industry, and particularly by the designers of enclosures for personal computers, file servers, telecommunication equipment, and similar systems which now operate at frequencies of 500 MHz or more. Indeed, as the processing speeds of electronic devices continue to increase with the attendant generation of higher frequency EMI radiation and greater heat output, enclosure designers are faced with the seemingly competing requirements of providing both adequate ventilation and effective EMI shielding. In such applications, a honeycomb shielding media, often may be preferred over other media as it is known to provide effective EMI shielding at higher frequencies with less restriction to air flow.

SUMMARY

In a first aspect of the invention, there is provided an EMI shielded vent panel for disposition over a corresponding opening in an electronics enclosure, the vent panel including an electrically conductive medium having a plurality of ventilation passageways, each passageway including an entry and a channel connected to and extending away from the entry; wherein each passageway is selectively actuated between at least a first constricted state and a second deconstricted state upon application of or removal of an activation mechanism.

In one embodiment, the electrically conductive medium includes an electroactive polymer and the activation mechanism includes an electric potential. Each passageway may be constricted when a first potential is applied to the electrically conductive medium and deconstricted when a second potential different from the first potential is applied to the electrically conductive medium or when the first potential is removed.

In one embodiment, the electroactive polymer includes an electrostatic silicone elastomer.

In another embodiment, the electrically conductive medium includes a shape memory polymer.

The activation mechanism may include a temperature change within the electronics enclosure.

In one embodiment, the activation mechanism includes an electric field.

In one embodiment, the activation mechanism includes a magnetic field.

In another aspect of the invention there is provided an EMI shielding system that includes (i) an EMI shielded vent panel for disposition over a corresponding opening in an electronics enclosure, the vent panel including an electrically conductive medium having a plurality of cells which define a plurality of ventilation passageways, each passageway including an entry and a channel connected to and extending away from the entry, wherein each passageway is selectively actuated between at least a first constricted state and a second deconstricted state upon application of or removal of an activation mechanism; (ii) a receiver configured to monitor EMI energy radiating into and out of the electronics enclosure; (iii) a thermocouple configured to monitor the temperature inside the electronic enclosure; and (iv) a controller configured to modulate the effective size of the entry of each passageway based on input received from the receiver and the thermocouple.

DETAILED DESCRIPTION

The EMI shielding vent panel of the present invention is adapted to cover a corresponding opening in an electronics housing or enclosure to provide ventilation while maintaining EMI shielding across the opening.

Figure 1:
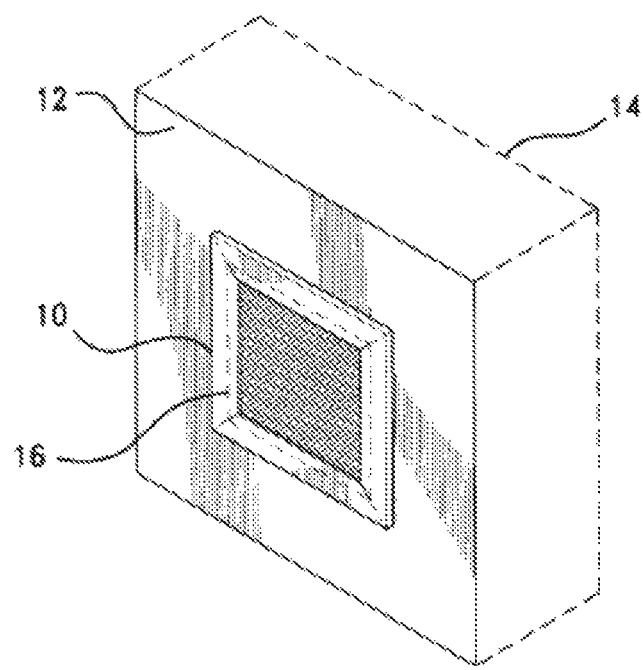
FIG. 1 is a perspective view of a representative electronics enclosure including an EMI shielded vent panel according to the present invention.

Referring to FIG. 1, EMI shielded vent panel 10 is mounted onto a surface 12 of an electronics enclosure, such as the EMI shielded housing shown in phantom at 14. Within this representative application, panel 10 is mounted using, for example, screws, bolts, or other fastening members, over a corresponding opening formed within housing 14. Such opening generally will be formed as having a predefined outer margin, shown in phantom at 16, about which panel 10 is circumscribed to cover the opening in a manner providing ventilation without compromising the EMI shielding effectiveness of the housing 14. It will be appreciated, however, that aspects of the present invention may find utility in other EMI shielding applications. For example, panel 10 alternatively may be mounted onto the wall of an EMI shielded room for covering a ventilation opening thereof. Use within those such other applications therefore should be considered to be expressly within the scope of the present invention.

Figure 2:
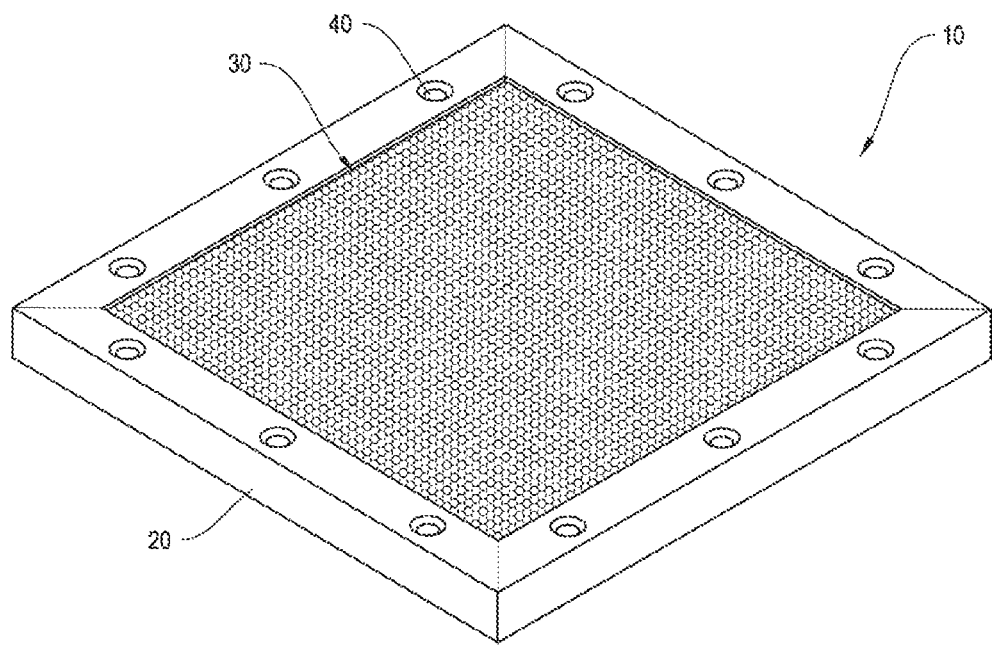
FIG. 2 is a perspective view of an embodiment of the vent panel of the invention.

FIG. 2 depicts, in general configuration, the EMI Shielding vent panel 10 of the invention. Vent panel 10 includes a frame member 20 and medium 30. Medium 30 is depicted as a honeycomb configuration comprising a plurality of cells joined together in a matrix configuration. Frame member 20 may include mounting holes 40 for receiving fastening members such as screws, bolts or the like. Alternatively, vent panel 10 may be attached to the surface of the enclosure using an electrically conductive adhesive, or otherwise as configured for an interference fit within the enclosure opening.

Figure 3:
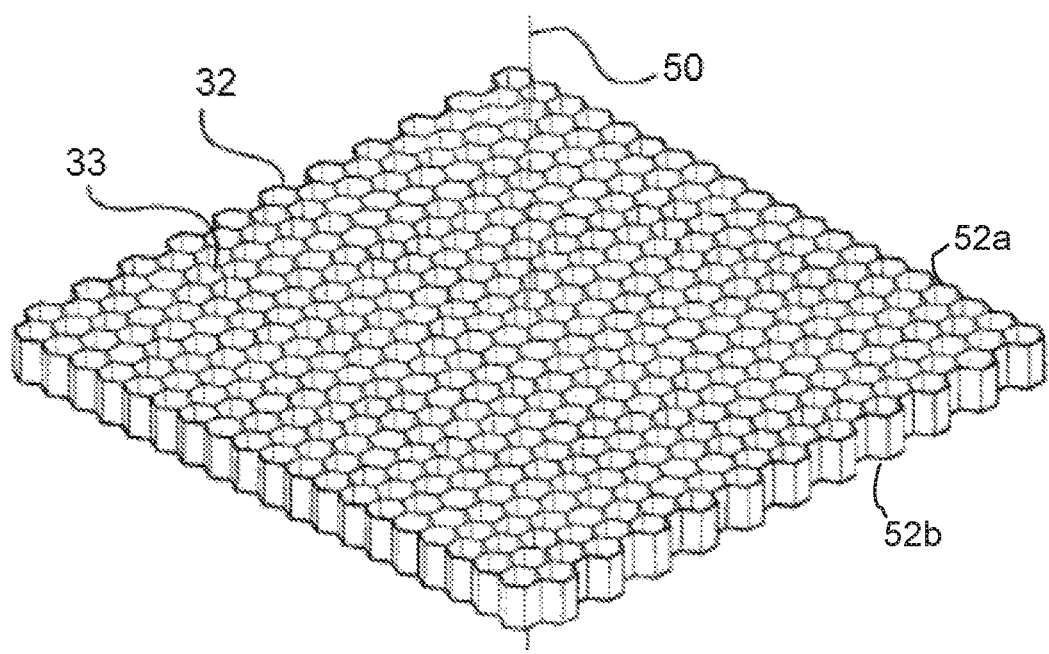
FIG. 3 is a perspective view of an exemplary medium of the vent panel having a hexagonal cellular structure.

Referring to FIG. 3, the medium 30 of the vent panel 10 extends along transverse axis 50 between a pair of opposing medium faces, 52a-b, defining a thickness dimension therebetween. As shown in FIG. 3, the medium may have a hexagonal, i.e., honeycombed, or other cellular structure that is "open" or otherwise porous to admit the flow of cooling air therethrough for the ventilation of the associated housing or other electronics enclosure. Each of the cells 32 defines a ventilation passageway having an opening 33 and extending through the thickness direction.

Manufacturers of electronics enclosures often must compromise between airflow and EMI attenuation in designing the enclosures. This is the airflow/EMI tradeoff. The design options are static and impose constraints on the performance of the system, even when they are not required at a given time. Having this airflow/EMI tradeoff ratio be dynamic allows the manufacturer of the electronic enclosure to meet requirements that are dynamic with a single vent. For example, a dynamic EMI vent allows for maximizing or increasing airflow through the enclosure when the need for EMI shielding effectiveness is decreasing or no longer exists. Electronics that operate at a lower temperature can have a longer service life.

The EMI shielding vent of the present invention self-regulates the aperture size of the cells depending upon the level and airflow, i.e., cooling, required at a given time. The EMI shielding system includes (i) a vent panel having a plurality of cells, slots or openings to allow for the passage of air, (ii) at least one receiver that monitors EMI energy radiating from the device and radiating from other devices; (iii) a thermocouple for monitoring the temperature inside the electronics enclosure; and (iv) a controller to modulate the effective cell size depending on the process conditions sent from the receiver and the thermocouple.

The cells or openings of the vent panel may include simple mechanical devices, electroactive polymer, shape memory polymer, or other shape-changing material. Electroactive polymers (EAPs) are polymers that exhibit a mechanical response, such as stretching, contracting, or bending, for example, in response to an electric field, or polymers that produce energy in response to a mechanical stress. One type of electroactive polymer will compress when a potential is applied across the polymer and expand when the potential is removed. An example of an electroactive polymer is an electrostatic silicone elastomer.

Shape memory polymers (SMPs) are polymeric smart materials that have the ability to return from a deformed state (i.e., temporary state) to their original (permanent) shape induced by an external trigger, such as temperature change, an electric field or a magnetic field. SMPs include thermoplastic and thermoset polymeric materials. SMPs can be formed into a variety of complex shapes using standard processing methods such as extrusion, molding, forming, etc. that is typically used in manufacturing processes of polymers. Examples of conducting SMP composites include polymers that contain conductive filler. Such conductive filler includes, but is not limited to, carbon nanotubes, short carbon fibers, carbon black and metallic Ni powder, and combinations of two or more thereof.

Figure 4B:
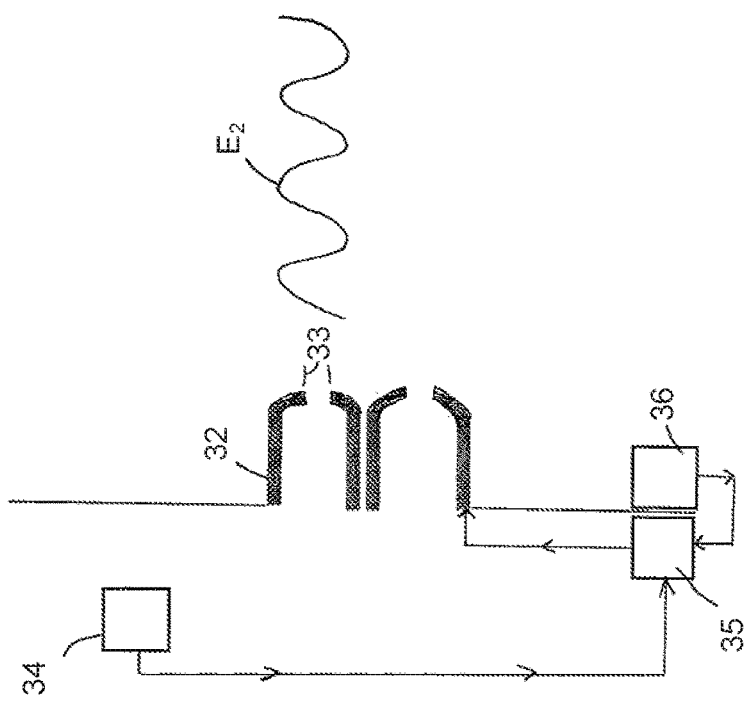
FIGS. 4A and 4B are schematic views of a portion of the vent panel in an open state and in a constricted state, respectively.
Figure 4A:
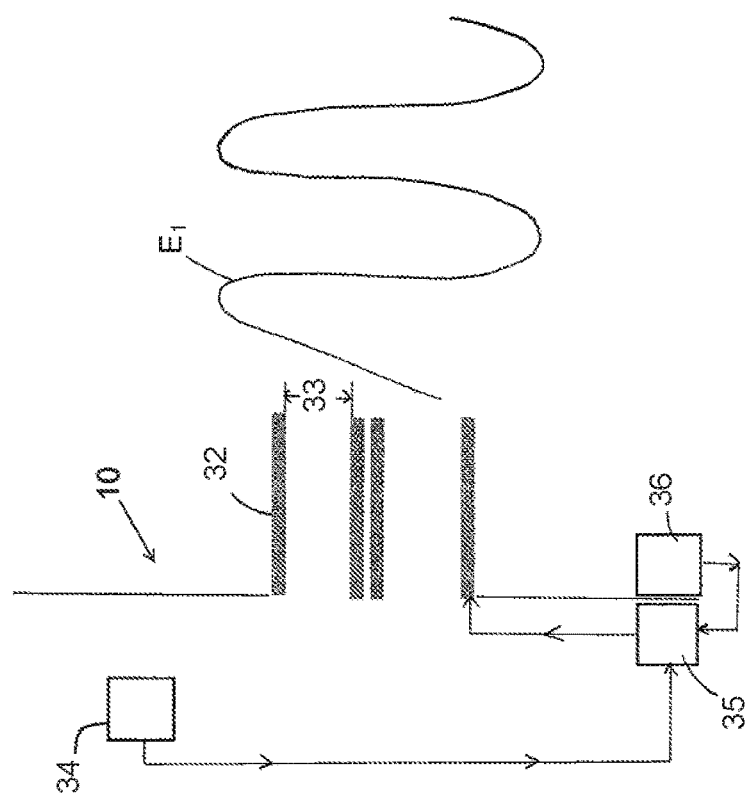

Referring to FIGS. 4A and 4B, the operation of an embodiment of the self-regulating EMI shielding vent panel is depicted. A plurality of cells 32 are constructed of an electroactive polymer or other shape memory material. The plurality of cells is electrically coupled to a controller 40. The controller 40 is electrically coupled to a receiver 36 and a thermocouple 34. The receiver 36 measures the EMI energy (E) of incoming radiation. The thermocouple 34 determines the temperature inside of the electronic enclosure 14. The controller 40 modulates the effective cell aperture 33 based upon the data received from the receiver 36 and the thermocouple 34.

In FIG. 4A, the EMI energy $E_1$ has a relatively low frequency and a relatively high wavelength. In response to the data received by the controller 40 from the receiver 36 and the thermocouple 34, the opening 33 of the cell 32 is configured by the controller to have an effective cell size of $S_1$. In FIG. 4B, the EMI energy $E_2$ has a relatively high frequency and a relatively low wavelength. In response to the data received by the controller 40 from the receiver 36 and the thermocouple 34, the opening 33 of the cell 32 is configured by the controller to have an effective cell size of $S_2$. $S_2$ is less than $S_1$, as the electroactive polymer of the cells 32 is triggered by the controller to alter the shape of the cells 32.

The vent panels of the invention can be used in a variety of applications and under a variety of conditions.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. An EMI shielded vent panel for disposition over a corresponding opening in an electronics enclosure, the vent panel comprising:
   an electrically conductive medium comprising a plurality of ventilation passageways, each passageway including an entry and a channel connected to and extending away from the entry;
   wherein each passageway is selectively actuated between at least a first constricted state and a second deconstricted state upon application of or removal of an activation mechanism.

2. The vent panel of claim 1, wherein the electrically conductive medium comprises an electroactive polymer and the activation mechanism comprises an electric potential.

3. The vent panel of claim 2, wherein each passageway is constricted when a first potential is applied to the electrically conductive medium and deconstricted when a second potential different from the first potential is applied to the electrically conductive medium or when the first potential is removed.

4. The vent panel of claim 2, wherein the electroactive polymer comprises an electrostatic silicone elastomer.

5. The vent panel of claim 1, wherein the electrically conductive medium comprises a shape memory polymer.

6. The vent panel of claim 5, wherein the activation mechanism comprises a temperature change within the electronics enclosure.

7. The vent panel of claim 1, wherein the activation mechanism comprises an electric field.

8. The vent panel of claim 1, wherein the activation mechanism comprises a magnetic field.

9. An EMI shielding system comprising:
   an EMI shielded vent panel for disposition over a corresponding opening in an electronics enclosure, the vent panel comprising an electrically conductive medium having a plurality of cells which define a plurality of ventilation passageways, each passageway including an entry and a channel connected to and extending away from the entry, wherein each passageway is selectively actuated between at least a first constricted state and a second deconstricted state upon application of or removal of an activation mechanism;
   a receiver configured to monitor EMI energy radiating into and out of the electronics enclosure;
   a thermocouple configured to monitor the temperature inside the electronic enclosure; and
   a controller configured to modulate the effective size of the entry of each passageway based on input received from the receiver and the thermocouple.

10. The EMI shielding system of claim 9, wherein the electrically conductive medium comprises an electroactive polymer and the activation mechanism comprises an electric potential.

11. The EMI shielding system of claim 10, wherein each passageway is constricted when a first potential is applied to the electrically conductive medium and deconstricted when a second potential different from the first potential is applied to the electrically conductive medium or when the first potential is removed.

12. The EMI shielding system of claim 9, wherein the electrically conductive medium comprises a shape memory polymer.

13. The EMI shielding system of claim 12 wherein the activation mechanism comprises a temperature change within the electronics enclosure.

14. The EMI shielding system of claim 9, wherein the activation mechanism comprises an electric field.

15. The EMI shielding system of claim 9, wherein the activation mechanism comprises a magnetic field.

16. The vent panel of claim 3, wherein the electroactive polymer comprises an electrostatic silicone elastomer.

* * * * *